United States Patent
Takagi et al.

(10) Patent No.: US 10,094,658 B2
(45) Date of Patent: Oct. 9, 2018

(54) OVERLAY MEASUREMENT METHOD, DEVICE, AND DISPLAY DEVICE

(71) Applicant: HITACHI HIGH-TECHNOLOGIES CORPORATION, Minato-ku, Tokyo (JP)

(72) Inventors: Yuji Takagi, Tokyo (JP); Fumihiko Fukunaga, Tokyo (JP); Yasunori Goto, Tokyo (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 72 days.

(21) Appl. No.: 15/329,519

(22) PCT Filed: Aug. 3, 2015

(86) PCT No.: PCT/JP2015/071953
§ 371 (c)(1),
(2) Date: Jan. 26, 2017

(87) PCT Pub. No.: WO2016/039041
PCT Pub. Date: Mar. 17, 2016

(65) Prior Publication Data
US 2017/0322021 A1    Nov. 9, 2017

(30) Foreign Application Priority Data

Sep. 11, 2014 (JP) .................. 2014-185445

(51) Int. Cl.
G06K 9/00    (2006.01)
G01B 15/04    (2006.01)
G06K 9/20    (2006.01)

(52) U.S. Cl.
CPC .............. *G01B 15/04* (2013.01); *G06K 9/20* (2013.01); *G06K 2009/2045* (2013.01)

(58) Field of Classification Search
CPC ... G01B 15/04; G06K 9/20; G06K 2009/2045
See application file for complete search history.

(56) References Cited

U.S. PATENT DOCUMENTS

| 6,296,977 | B1 * | 10/2001 | Kaise | G03F 7/70241 |
| | | | | 430/22 |
| 2005/0275848 | A1 * | 12/2005 | Hill | G01B 11/2441 |
| | | | | 356/512 |

(Continued)

FOREIGN PATENT DOCUMENTS

| JP | 2005-521254 A | 7/2005 |
| JP | 2013-168595 A | 8/2013 |

*Primary Examiner* — Ali Bayat
(74) *Attorney, Agent, or Firm* — Miles & Stockbridge P.C.

(57) ABSTRACT

To address the problem in which when measuring the overlay of patterns formed on upper and lower layers of a semiconductor pattern by comparing a reference image and measurement image obtained through imaging by an SEM, the contrast of the SEM image of the pattern of the lower layer is low relative to that of the SEM image of the pattern of the upper layer and alignment state verification is difficult even if the reference image and measurement image are superposed on the basis of measurement results, the present invention determines the amount of positional displacement of patterns of an object of overlay measurement from a reference image and measurement image obtained through imaging by an SEM, carries out differential processing on the reference image and measurement image, aligns the reference image and measurement image that have been subjected to differential processing on the basis of the positional displacement amount determined previously, expresses the gradation values of the aligned differential reference image and differential measurement image as brightnesses of colors that differ for each image, superposes (Continued)

the images, and displays the superposed images along with the determined positional displacement amount.

19 Claims, 12 Drawing Sheets

(56) References Cited

U.S. PATENT DOCUMENTS

| | | |
|---|---|---|
| 2006/0233433 A1 | 10/2006 | Flieswasser et al. |
| 2007/0221842 A1* | 9/2007 | Morokuma ........ G01N 23/2251 250/307 |
| 2013/0100427 A1* | 4/2013 | Koolen ..................... G03F 1/42 355/67 |
| 2014/0375793 A1 | 12/2014 | Harada et al. |
| 2015/0041649 A1* | 2/2015 | Wang ................... H01J 37/222 250/310 |
| 2015/0212019 A1* | 7/2015 | Shishido ................ G01B 15/04 250/307 |
| 2016/0372893 A1* | 12/2016 | McLaurin ............. H01S 5/4093 |

* cited by examiner

F I G. 6
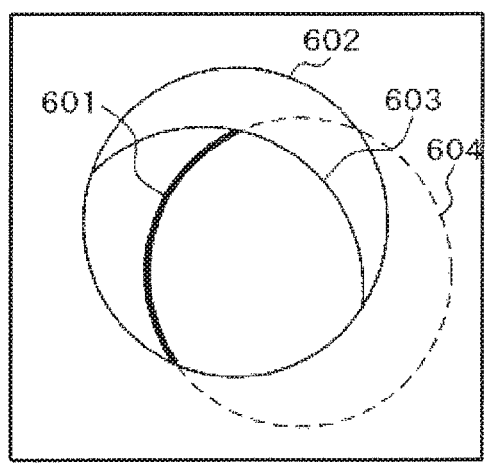

F I G. 1 4
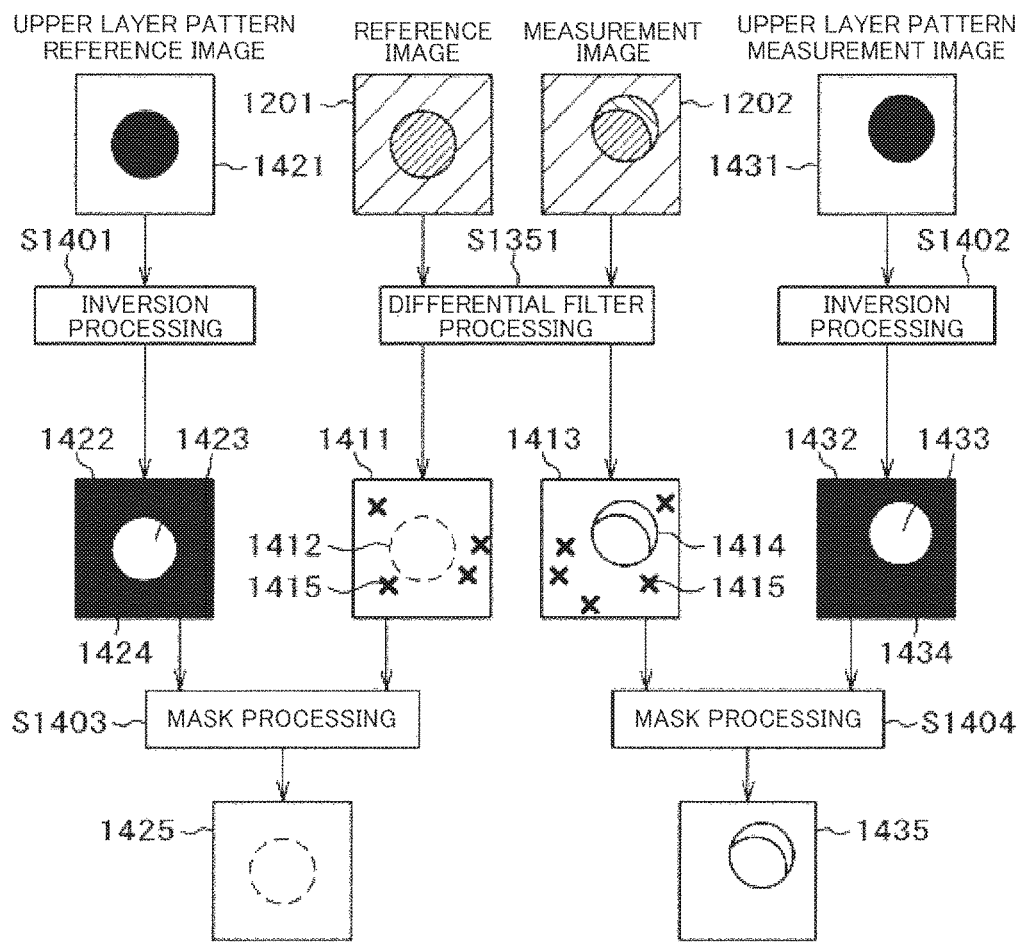
F I G. 1 5
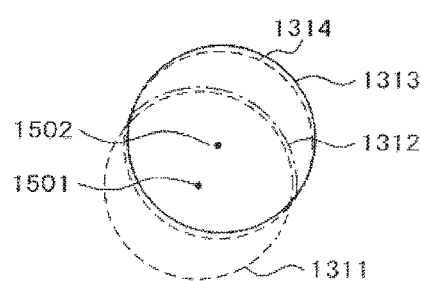

F I G. 1 6
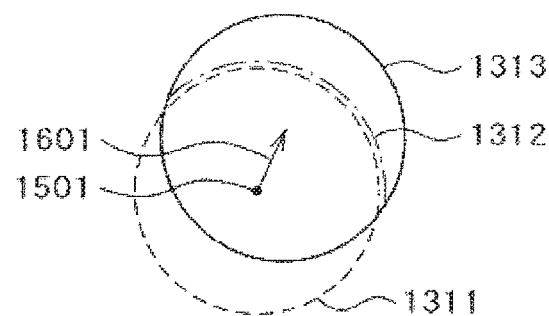
F I G. 1 7
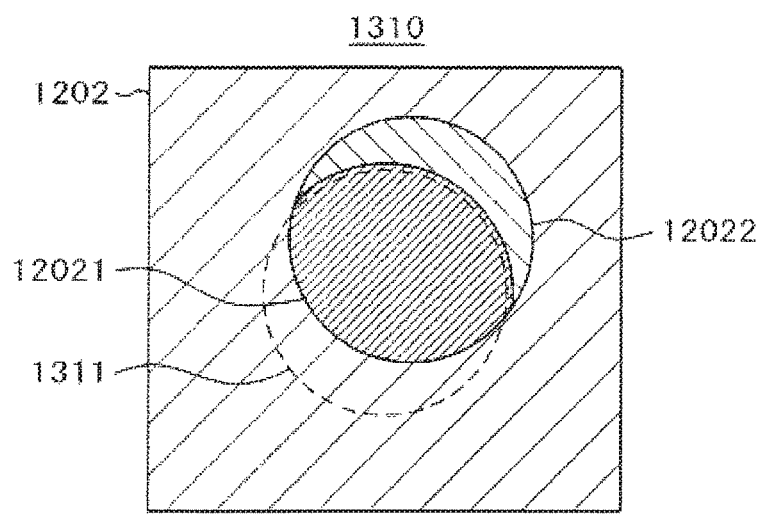

F I G. 1 8
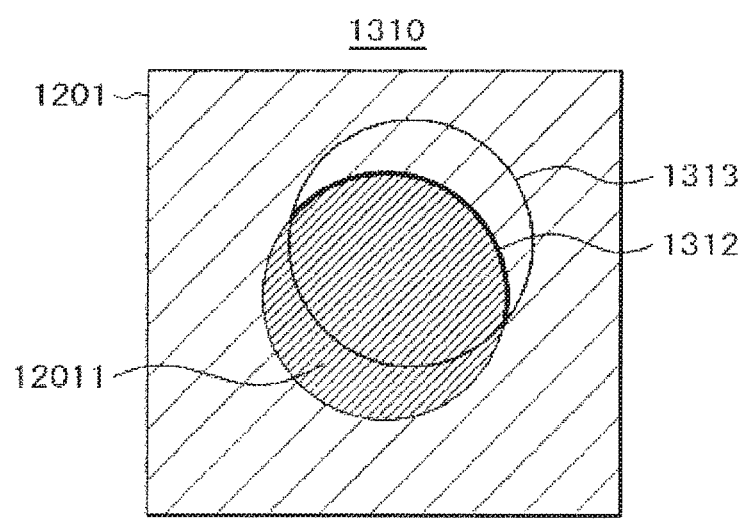

F I G. 2 0
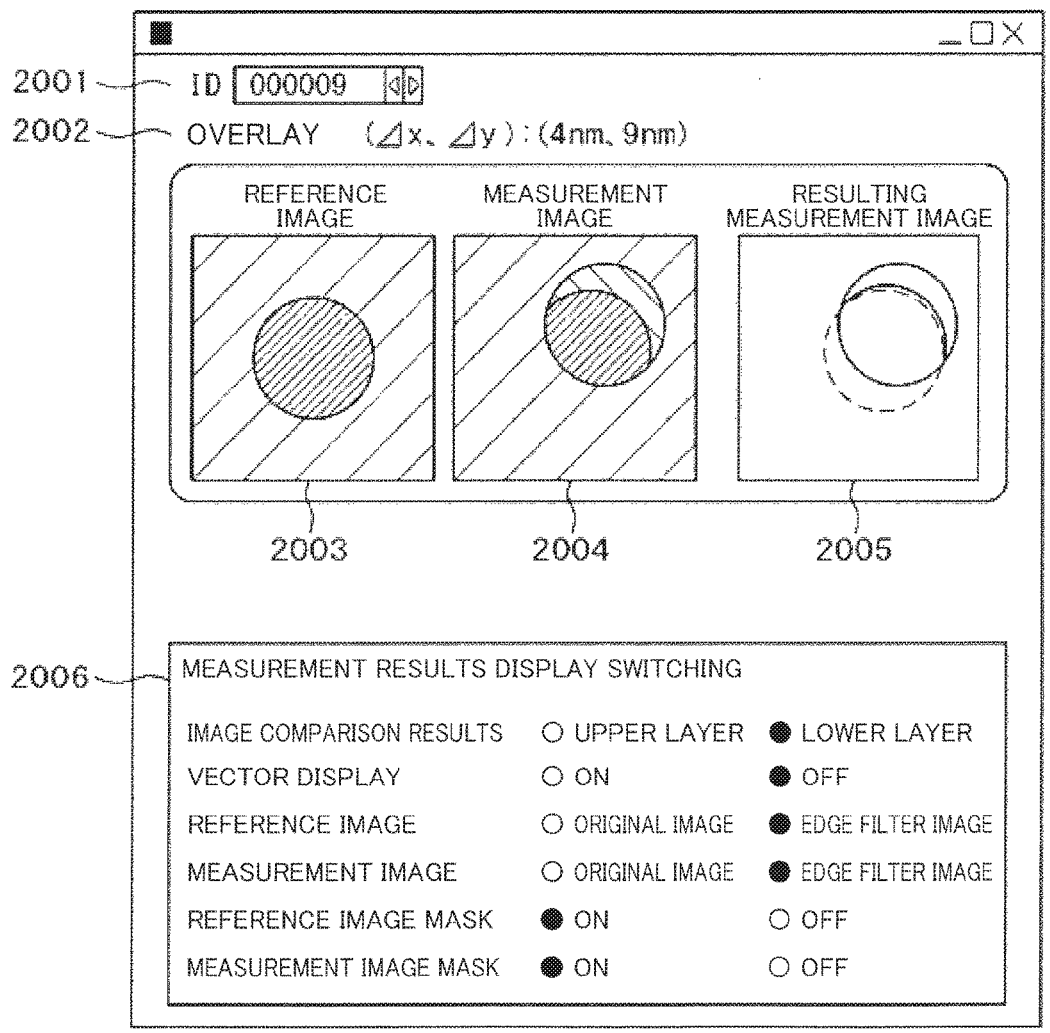

OVERLAY MEASUREMENT METHOD, DEVICE, AND DISPLAY DEVICE

TECHNICAL FIELD

The present invention relates to a method of measuring misalignment (overlay) between patterns created in different manufacturing processes in manufacture of a semiconductor wafer, a device therefor, and a display method therefor, and more specifically to a method of measuring overlay by using an image obtained through photographing with a charged particle microscope, a device therefor, and a display device therefor.

BACKGROUND ART

For semiconductor device products, a plurality of times of exposure processes are required to form a circuit pattern required for operation. For example, in manufacture of a device formed of multilayered circuit patterns, in addition to the exposure process for forming each layer of the circuit pattern, an exposure process for forming a hole connecting together the layers is required. Position of the circuit patterns formed through the aforementioned plurality of times of exposure processes needs to fall within a permitted range, and upon deviation from the permitted range, appropriate electric characteristics cannot be obtained, resulting in yield deterioration. Thus, measurement of circuit pattern misalignment (overlay) between the exposures and feedback thereof to an exposure device have been practiced.

Following miniaturization of semiconductor processes, the permitted overlay range has become smaller and thus has become important to directly measure the overlay in a place where the product circuit pattern is formed. To realize this, Japanese Patent Application Laid-open No. 2013-168595 (Patent Literature 1) describes a technique of photographing an image of a product circuit pattern with a scanning electron microscope (SEM) and measuring overlay.

The overlay measurement method described in Patent Literature 1 measures the overlay through image positional alignment between a reference image and a measured image, and FIG. 30 in Patent Literature 1 describes a method of providing a display of measurement results as detection results of a differential part between the reference image and the measured image.

Japanese Unexamined Patent Application Publication No. 2005-521254 describes a method of coloring a reference image and an inspected image to make a difference therebetween visible. More specifically, the method refers to an inspection method of image comparison between the reference image and the inspected image and a method of obtaining an inspected defective image by image coupling of a framework image of the colored reference image, an edge framework image of the colored reference image, and an inspected object of the colored inspected image.

CITATION LIST

Patent Literature

PTL 1: Japanese Patent Application Laid-open No. 2013-168595

PTL 2: Japanese Unexamined Patent Application Publication No. 2005-521254

SUMMARY

Technical Problem

Patent Literature 1 describes that the overlay measurement based on the product circuit patterns of a semiconductor device is carried out by performing image positional alignment between the different patterns of the reference image and the measurement image targeted for the overlay measurement. Comparison between the reference image and the measurement image is a practical method in the overlay measurement targeted on the product circuit patterns, but it is required to visually check a state of the image positional alignment for the purpose of adjustment of an image processing parameter used for the image positional alignment and for the purpose of confirmation of the measurement results.

In a case where a targeted process of the overlay measurement is a hole process, that is, in a case where there is positional misalignment between a hole formed at an upper layer and a pattern formed at a lower layer located at a hole bottom observed through the aforementioned hole, gray of an image obtained by photographing, with an SEM, the pattern formed at the lower layer observed through the hole bottom is relatively smaller than gray of an SEM image of the hole pattern formed at the upper layer, and thus upon direct mutual superposition of the reference image and the measurement image obtained in the hole process by photographing with a scanning electron microscope, it is difficult to visually confirm a state of the positional alignment of the hole bottom pattern.

Patent Literature 1 describes that as the method of displaying the results of the positional alignment between the reference image and the measurement image, the detection results of the differential part between the reference image and the measurement image are displayed. Described as the method of detecting a differential part is a method of calculating a difference in a gray value after the positional alignment between the reference image and the measurement image and defining, as the differential part, a region including pixels where a value of the difference becomes equal to or larger than a given value.

FIG. 1 and FIG. 2 illustrates schematic diagrams of an image obtained by photographing, with an SEM, hole patterns formed on a circuit pattern of a semiconductor in a hole formation process. Illustrated in the schematic diagrams is how a lower layer pattern 103 at a hole bottom of a hole pattern 102 formed at a surface layer 101 is viewed. FIG. 1 is the schematic diagram illustrating a state in which there is no misalignment (overlay) between the hole pattern 102 and the lower layer pattern (pad in examples of FIG. 1 and FIG. 2) 103, resulting in a reference image. FIG. 2 illustrates a measurement image in a state in which there is misalignment (overlay) between the hole pattern 102 and the lower layer pattern 103 at the hole bottom. It is illustrated that an a base 201 of the layer on which the lower layer pattern 103 viewed at the hole bottom of the hole pattern 102 is viewed is observed darker. On the scanning electron microscope, electrons detected from the pattern formed at the lower layer at the hole bottom of the hole pattern 102 is smaller than electrons detected from the upper layer 101 on the surface, so that the lower layer pattern 103 at the hole bottom becomes darker.

FIG. 3 and FIG. 4 are obtained by mutually superposing and line-drawing the reference image of FIG. 1 and the measurement image of FIG. 2. Broken lines of FIG. 3 and FIG. 4 represent an edge 304 or 404 of the hole pattern 102 and the lower layer pattern 103 at the hole bottom in the reference image of FIG. 1, and solid lines represent an edge 303 or 403 of the hole pattern 102 and an edge 302 or 402 of the lower layer pattern 103 at the hole bottom in the measurement image of FIG. 2. With the method described in Patent Literature 1, image positional alignment is performed on an individual pattern basis. A diagrammatic view 301 of FIG. 3 represents an example where the positional alignment is performed properly with the edge 304 of the lower layer pattern 103 at the hole bottom obtained from the measurement image of FIG. 1 and the edge 302 of the lower layer pattern 103 at the hole bottom obtained from the measurement image of FIG. 2, and a diagrammatic view 401 of FIG. 4 represents an example where the positional alignment was not performed properly with the edge 404 of the lower layer pattern 103 at the hole bottom obtained from the reference image of FIG. 1 and the edge 402 of the lower layer pattern 103 at the hole bottom obtained from the measurement image of FIG. 2.

Ways of superposition of regions 311 to 313 and 411 to 415 marked with numerals in FIG. 3 and FIG. 4 are different from that of regions 101 to 103 and 201 marked with numerals in the reference image of FIG. 1 and the measurement image of FIG. 2, and there is also a difference in a gray value between the reference image of FIG. 1 and the measurement image of FIG. 2. In actual images, there is brightness non-uniformity in the regions marked with the numerals in FIG. 1 and FIG. 2, and since the regions marked with the numerals in FIG. 1 and FIG. 2 are photographed at different positions of the device, thus resulting in non-uniformity in the gray value. Thus, the gray value roughly differs among the regions illustrated in FIG. 3 and FIG. 4, but the difference therebetween becomes more unclear, thus resulting in difficulties in clearly indicating the regions as illustrated in FIG. 3 and FIG. 4 in the difference in the gray value. Therefore, as in Patent Literature 1, even when a region such that a differential part between the reference image and the measurement image becomes equal to or larger than a given value is displayed, it is difficult to judge whether or not image positional alignment has properly been performed by each pattern.

Patent Literature 2 describes a method of performing coloring on a reference image and an inspected image and detecting a difference between the reference image and the inspected image. However, positional alignment between the reference image and the inspected image is not performed with reference to either one of the patterns targeted for overlay measurement, thus resulting in failure to display results of the image positional alignment performed as the overlay measurement. Moreover, even when the positional alignment is performed with each pattern targeted for the overlay measurement, an image which permits judgement whether or not the image positioning has properly been performed cannot be obtained even by image coupling, through logical calculation, a frame image of the reference image or an edge image and an inspected object of the inspected image.

Bold lines 501 and 601 of FIG. 5 and FIG. 6 indicate results of taking, as inspected objects, a logical product of the edge image 302 or 402 of the lower layer pattern 103 at the hole bottom of the reference image in FIG. 3 and FIG. 4 and regions 312, 412, and 414 of the lower layer pattern of the measurement image in FIG. 3 and FIG. 4. Thin lines 502 and 503 of FIG. 5 and thin lines 602 to 604 of FIG. 6 refer to line drawings illustrated in FIG. 3 and FIG. 4. With only the bold lines 501 and 601 illustrated in FIG. 5 and FIG. 6, it cannot be judged whether or not the positional alignment has properly been performed.

The present invention address the problem of the conventional art, and provides, in a method of overlay measurement through comparison between a reference image and a measurement image based on a product circuit image of a semiconductor device obtained by photographing with a scanning electron microscope, an overlay measurement method, a device and a display device capable of easily confirming results of the comparison between the reference image and the measurement image.

Solution to Problem

To address the problem described above, the present invention refers to a method of measuring overlay between patterns formed at different layers of a semiconductor device, and the method includes: acquiring a reference image including a pattern without overlay as misalignment between the pattern formed at the upper layer of the semiconductor device and the pattern formed at the lower layer thereof by using a scanning electron microscope; acquiring a measurement image including the pattern targeted for the measurement and formed at the upper layer of the semiconductor device and the pattern formed at the lower layer thereof by using the scanning electron microscope; calculating a positional misalignment amount of the patterns corresponding to the acquired reference image and the acquired measurement image; generating a differential reference image and a differential measurement image through differential processing performed on the acquired reference image and the acquired measurement image; generating a colored differential reference image through coloring with a first color having an intensity value corresponding to a gray value of the generated differential reference image and generating a colored differential measurement image through coloring with a second color being different from the first color and having an intensity value corresponding to a gray value of the generated differential measurement image; performing positional correction on the colored differential reference image or the colored differential measurement image by using information of the calculated positional misalignment amount of the pattern; and mutually superposing the colored differential reference image and the colored differential measurement image subjected to the positional correction and displaying the colored differential reference image and the colored differential measurement image together with the information of the calculated positional misalignment amount of the patterns.

Moreover, to address the problem described above, the invention refers to an overlay measurement device which measures overlay of patterns formed at different layers of a semiconductor device, and the overlay measurement device includes: scanning electron microscopic adapted to acquire a reference image by imaging a region including the pattern without overlay as misalignment between the pattern formed at the upper layer of the semiconductor device and the pattern formed at the lower layer thereof, and to acquire a measurement image by imaging a region including the pattern targeted for the measurement and formed at the upper layer of the semiconductor device and the pattern targeted for the measurement and formed at the lower layer of the semiconductor device; positional misalignment amount calculator adapted to calculate an amount of positional misalignment between the patterns corresponding to the reference image and the measurement image acquired by the scanning electron microscope; differential image generator adapted to generate a differential reference image and a differential measurement image by subjecting, to differential processing, the reference image and the measurement image acquired by the scanning electron microscope; colored differential image generator adapted to generate a colored differential reference image by coloring in a first color having an intensity value corresponding to a gray value of the differential reference image generated by the differential image generator, and generating a colored differential measurement image by coloring in a second color being different from the first color and having an intensity value corresponding to a gray value of the differential measurement image generated by the differential image generator; image positional corrector adapted to perform positional correction on the colored differential reference image or the colored differential measurement image generated by the colored differential image generator by using information of the amount of the positional misalignment between the patterns calculated by the positional misalignment amount calculator; and display unit adapted to mutually superpose the colored differential reference image and the colored differential measurement image subjected to the positional correction performed by the image positional corrector, and to display the colored differential reference image and the colored differential measurement image together with the information of the amount of the positional misalignment between the patterns calculated by the positional misalignment amount calculator.

Further, to address the problem described above, the invention refers to a device displaying measurement results of overlay of patterns formed at different layers of a semiconductor device, the measurement being achieved through comparison between a reference image in a region including the pattern without overlay as misalignment between the pattern formed at the upper layer of the semiconductor device and the pattern formed at the lower layer thereof both of which are acquired by photographing with a scanning electron microscope and a measurement image in a region including the pattern targeted for the measurement and formed at the upper layer of the semiconductor device and the pattern targeted for the measurement and formed at the lower layer of the semiconductor device, wherein a colored differential reference image obtained by coloring in a first color having an intensity value corresponding to a gray value of a differential filter image of the reference image and a colored differential measurement image obtained by coloring in a second color different from the first color and having an intensity value corresponding to a gray value of a differential filter image of the measurement image are superposed on each other to be displayed.

Advantageous Effects of Invention

With one aspect of the present invention, in overlay measurement performed with a product circuit of a semiconductor device through comparison between a reference image and a measurement image by using an SEM image obtained by photographing the semiconductor device with a scanning electron microscope (SEM), when the reference image and the measurement image are shifted for superposed display thereof, the superposed display can be performed with favorable visibility.

BRIEF DESCRIPTION OF DRAWINGS

FIG. 6 is a diagrammatic view illustrating, in a bold line, an edge portion of a pattern formed at the lower layer of the hole pattern as a result of taking AND of an edge image of the pattern formed at the lower layer of the hole pattern in the reference image of FIG. 4 and a region of the pattern formed at the lower layer of the hole pattern in the measurement image, which are provided as inspected objects.

FIG. 14 is a flowchart illustrating procedures of generating a reference image and a measurement image involved in mask processing according to a modified example of Example of the invention.

FIG. 15 is a diagram illustrating a state in which display images 1310 and 1315 are superposed on each other according to the modified example of Example of the invention.

FIG. 16 is a diagram displaying, in a vector, a change in a representative position of a hole pattern in the state in which the display images 1310 and 1315 are superposed on each other according to the modified example of Example of the invention.

FIG. 17 illustrates an example of a display image in a state in which a measurement image is superposed on the display image 1310 of FIG. 13 according to the modified example of Example of the invention.

FIG. 18 illustrates an example of a display image in a state in which a reference image is superposed on the display image 1310 of FIG. 13 according to the modified example of Example of the invention.

FIG. 20 is an elevation view of a display screen illustrating configuration of a screen displaying results of measuring the overlay according to Example of the invention.

DESCRIPTION OF EMBODIMENTS

The present invention relates to measurement of pattern overlay between layers circuit patterns formed at multiple layers of a semiconductor device, and permits superposed display with favorable visibility when a reference image and a measurement image provided by an SEM image obtained by imaging the circuit patterns are subjected to positional correction in accordance with an overlay amount obtained by using the reference image and the measurement image and are displayed in a mutually superposed manner.

Hereinafter, embodiments of the present invention will be described with reference to the drawings.

Embodiment 1

Figure 7:
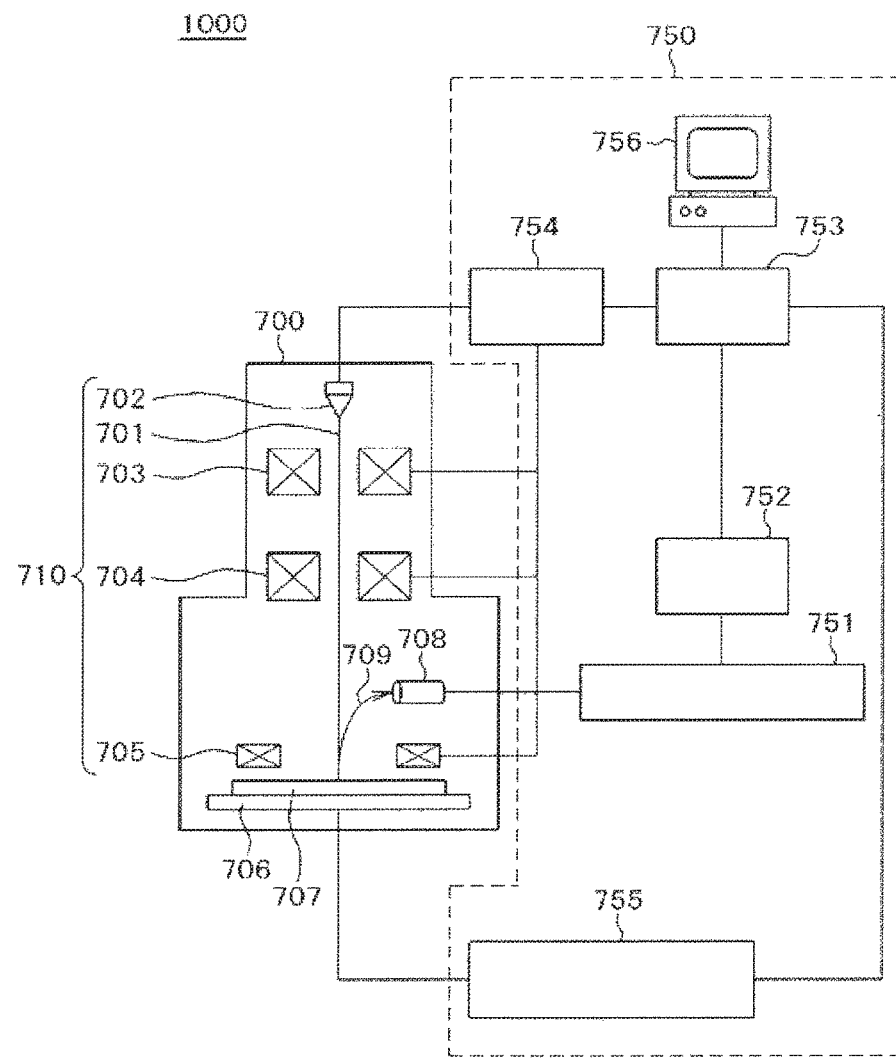
FIG. 7 is a block diagram illustrating schematic configuration of an overlay measurement device according to Example of the present invention.

FIG. 7 shows an overall configuration diagram of an overlay measurement device 1000 according to the present invention. The overlay measurement device 1000 includes a scanning electron microscope device 700 and a processing and control section 750.

The scanning electron microscope device 700 includes: a stage 706 on which a semiconductor wafer 707 is loaded; an irradiation optical system 710 controlling an electron beam 701 emitted from an electron gun 702; and a detector 708 detecting a secondary electron or a reflective electron 709 emitted from above a sample (the semiconductor wafer 707) to which the electron beam 701 is irradiated. The irradiation optical system 710 includes the electron gun 702, capacitor lenses 703; deflection coils 704, and objective lenses 705 which are located on a route of the electron beam 701. The electron beam 701 is focused by the irradiation optical system 710 on a predetermined region in which a defect to be observed is exist on the semiconductor wafer 707.

The processing and control section 750 includes: an A/D converter 751, an image processing section 752, an overall control section 753, an electron optical system control section 754, a stage controller 755, and a display terminal 756.

On the scanning electron microscope device 700, a detection signal outputted from the detector 708 that has detected the secondary electron or the reflective electron emitted from the semiconductor wafer 707, to which the electron beam 701 has been emitted, is converted into a digital signal by the A/D converter 751. The digital signal obtained through the conversion is transmitted to the image processing section 752, in which image processing is performed using the digital signal transmitted from the A/D converter 751, for example, detection of a defective position in an image is performed, and then results of the aforementioned operation is outputted to display at the display terminal 756 via the overall control section 753. In response to a control signal from the overall control section 753, the stage controller 755 drives the stage 706 of the scanning electron microscope device 700. In response to the control single from the overall control section 753, the electron optical system control section 754 controls, for example, the electron gun 702, the capacitor lenses 703, the deflection coils 704, and the objective lenses 705 of the scanning electron microscope device 700.

A recording medium (not illustrated) can be connected to the image processing section 752, the overall control section 753, and the display terminal 756, and a program to be executed in the image processing section 752 can be read from the recording medium and loaded onto the image processing section 752.

In a description of overlay measurement below, an example of a device pattern formed on the semiconductor wafer 707 and targeted for the measurement will be described with reference to schematic diagrams of FIG. 8 and FIG. 10 and an example of a captured image of the device pattern will be described with reference to FIG. 9 and FIG. 11.

Figure 1:
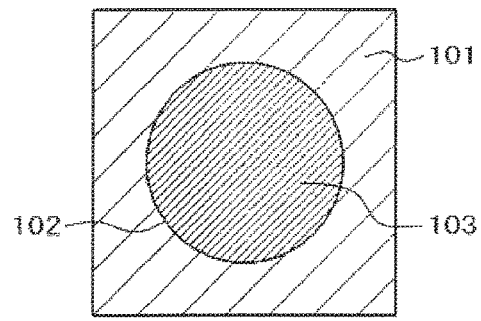
FIG. 1 is a schematic diagram of an image obtained by photographing, with a scanning electron microscope, a semiconductor device on which a hole pattern has been formed through a hole pattern formation process, illustrating a state in which there is no misalignment between the hole pattern and a pattern formed at a lower layer.
Figure 2:
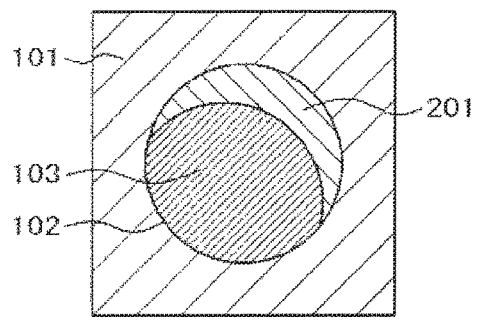
FIG. 2 is a schematic diagram of a measurement image in a hole process, i.e., the image obtained by photographing, with the scanning electron microscope, the semiconductor device on which the hole pattern has been formed through the hole pattern formation process, illustrating a state in which there is misalignment between the hole pattern and the pattern formed at the lower layer.
Figure 3:
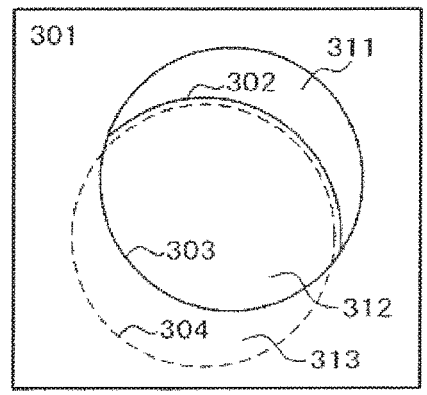
FIG. 3 is a line drawing obtained by extracting edges of the patterns respectively observed on the reference image of FIG. 1 and the measurement image of FIG. 2, illustrating a state in which positional alignment has been properly performed based on the pattern edges extracted from the respective images.
Figure 4:
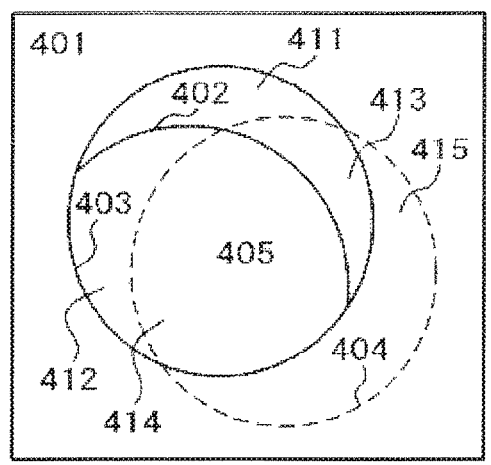
FIG. 4 is a line drawing obtained by extracting the edges of the patterns respectively observed on the reference image of FIG. 1 and the measurement image of FIG. 2, illustrating a state in which the positional alignment has not been properly performed based on the pattern edges extracted from the respective images.
Figure 5:
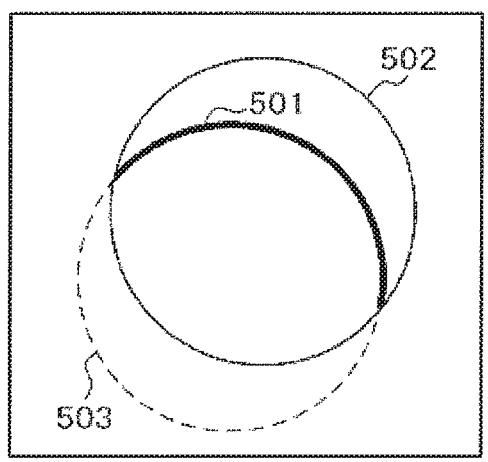
FIG. 5 is a diagrammatic view illustrating, in a bold line, an edge portion of a pattern formed at the lower layer of the hole pattern as a result of taking AND of an edge image of the pattern formed at the lower layer of the hole pattern in the reference image and a region of the pattern formed at the lower layer of the hole pattern in the measurement image, which are provided as inspected objects.
Figure 8:
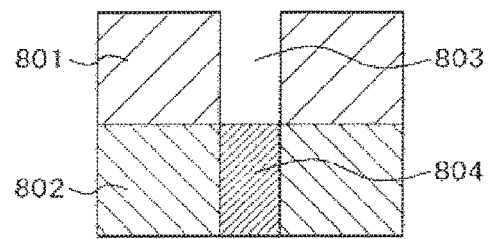
FIG. 8 is a partially sectional view of a semiconductor device having a contact plug formed at a lower layer and a hole pattern formed on an upper layer, illustrating a state in which there is no misalignment between the contact plug at the lower layer and the hole pattern at the upper layer.

FIG. 8 is a schematic cross-sectional view with a simplified partial cross section of a semiconductor device having a contact plug 804 formed at a lower layer 802 (although omitted from illustration, a thin film of a contact pad having almost the same diameter as that of the contact plug is formed on a surface of the contact plug 804, and in the example of FIG. 1, the contact pad is actually observed) and having a hole pattern 803 formed at an upper layer 801, illustrates a state in which the contact plug 804 at the lower layer and the hole pattern 803 at the upper layer are arrayed without misalignment.

Figure 9:
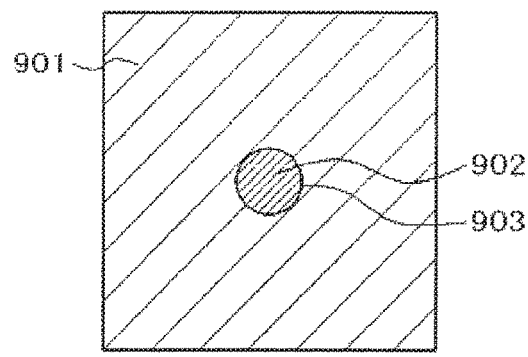
FIG. 9 is a schematic diagram of an image obtained by photographing the semiconductor device in the state of FIG. 8 with a scanning electron microscope.

FIG. 9 illustrates an SEM image obtained upon imaging a region including the hole pattern 803 of FIG. 8 from the above by using the scanning electron microscope device 700, and the upper layer 801 of FIG. 8 is imaged as a region 901, the contact plug 804 at the lower layer is imaged as a region 902, and an outline of the hole pattern 803 is imaged as a pattern 903. Hereinafter, the contact plug 804 which is observed through the hole pattern 803 and formed at the lower layer 802 in the SEM image obtained by imaging with the scanning electron microscope device 700 is called the lower layer pattern 902. The SEM image corresponding to the hole pattern 803 created at the upper layer 801 may simply be called the upper layer pattern 903.

Figure 10:
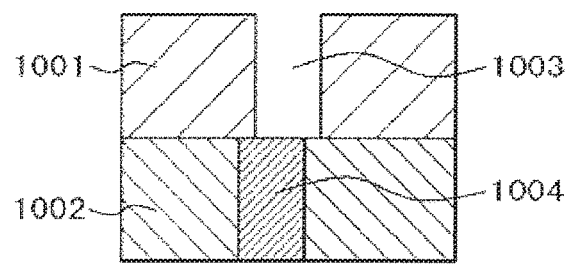
FIG. 10 is a partially sectional view of a semiconductor device having a contact plug formed a lower layer and a hole pattern formed at an upper layer, illustrating a state in which there is misalignment between the contact plug at the lower layer and the hole pattern at the upper layer.

FIG. 10 is a schematic cross-sectional view with a simplified partial cross section of a semiconductor device having a contact plug 1004 formed at a lower layer 1002 and a hole pattern 1003 formed at an upper layer 1001, illustrating a state in which the contact plug 1004 at the lower layer and the hole pattern 1003 at the upper layer are being misaligned with each other.

Figure 11:
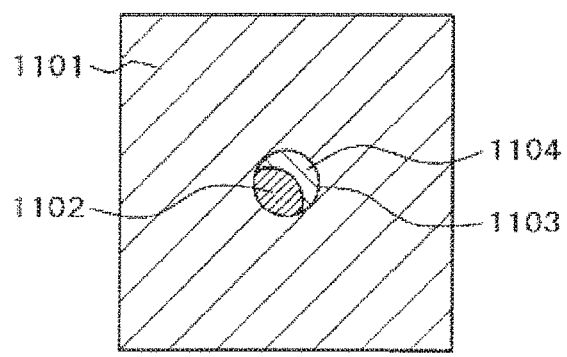
FIG. 11 is a schematic diagram of an image obtained by photographing the semiconductor device in the state of FIG. 10 with the scanning electron microscope.

FIG. 11 illustrates an SEM image of a region 1101 corresponding to a surface of the upper layer 1001 obtained by imaging a region including the hole pattern 1003 of FIG. 10 from the above by using the scanning electron microscope device 700, and with respect to an outline 1103 of the hole pattern 1003, a region 1102 of the contact plug 1004 at the lower layer is misaligned, and the lower layer 1002 is imaged as a region 1104 which is darkest in FIG. 11.

The overlay measurement is intended to find misalignment between the hole pattern 803 (1003) formed at the upper layer 801 (1001) and the contact plug 804 (1004) formed at the lower layer 802 (1002). The captured images are processed to measure the misalignment between the lower layer pattern 902 (1002) in the SEM image illustrated in FIG. 9 (FIG. 11) corresponding to the contact plug 804 (1004) formed at the lower layer 802 (1002) in the sectional view of FIG. 8 (FIG. 10) and the hole pattern expressed by the upper layer pattern 903 (1103) in the SEM image illustrated in FIG. 9 (FIG. 11) corresponding to the hole pattern 803 (1003) formed at the upper layer 801 (1001) in the sectional view of FIG. 8 (FIG. 10).

The pattern 804 or 1004 formed at the lower layer 802 or 1002 has been described as the contact plug in FIG. 8 and FIG. 10, but the pattern formed at the lower layer 802 or 1002 is not limited to the contact plug, and a different pattern is also permitted. Moreover, the hole pattern 903 or 1103 is illustrated in a circle in FIG. 9 and FIG. 11, but a shape of the hole in the image is not limited to the circle.

In the overlay measurement performed through comparison between the reference image and the measurement image described in the present embodiment, an image in a state in which the two patterns targeted for the overlay measurement as in FIG. 9, that is, the upper layer pattern 903 corresponding to the hole pattern 803 and the lower layer pattern 902 corresponding to the contact plug 804 in the aforementioned example are aligned is provided as a reference image. The reference image may be created by imaging one or a plurality of places through user selection. In the overlay measurement performed through comparison between a reference image and a measurement image described below by referring FIG. 12, the region 902 and the outline 903 of the reference image are used as hole and outline information of the region on the surface of the upper layer, and the region 902 and the outline 903 are used as outline and region information of a hole bottom of the hole pattern 803 serving as a surface of boundary with the lower layer pattern.

Figure 12:
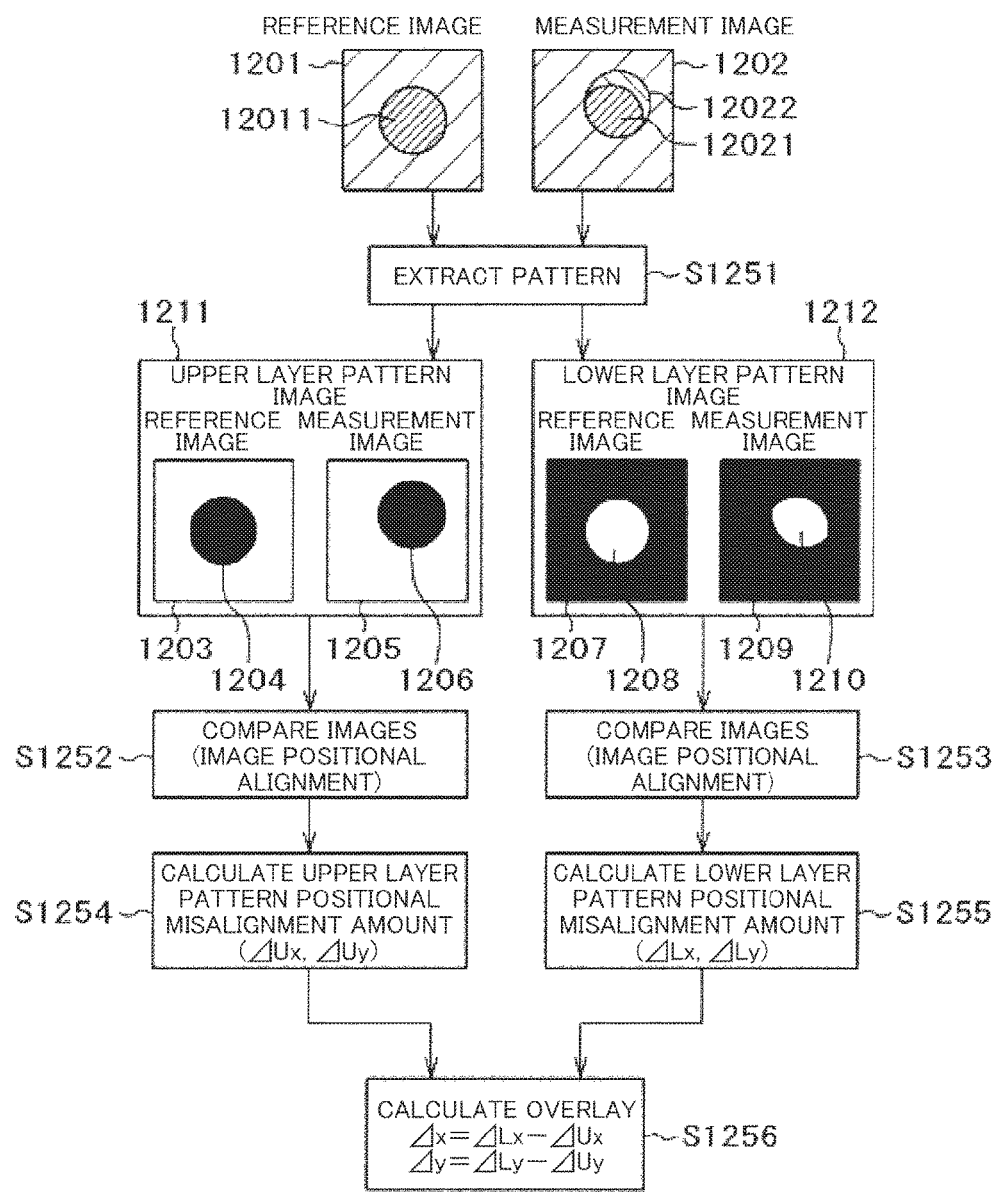
FIG. 12 is a flowchart illustrating procedures of processing of calculating overlay according to Example of the invention.

FIG. 12 shows a flow of overlay measurement processing performed through comparison between the reference image and the measurement image in the SEM image of the semiconductor wafer 707 obtained by using the scanning electron microscope device 700. First, patterns targeted for the overlay measurement are extracted respectively from a reference image 1201 (corresponding to the image described in FIG. 9) including a lower layer pattern image 12011 and a measurement image 1202 (corresponding to the image described in FIG. 11) including a lower layer pattern image 12021 targeted for the overlay measurement and a lower layer image 12022 (S1251) to create upper layer pattern images 1211 and lower layer pattern images 1212. As the upper layer pattern images 1211, a reference image 1203 including a hole pattern image 1204 and a measurement image 1205 including a hole pattern image 1206 are created. As the lower layer pattern images 1212, a reference image 1207 including a contact plug pattern image 1208 corresponding to the lower layer pattern image 12011 and a measurement image 1209 including a contact plug pattern image 1210 corresponding to the lower layer pattern image 12021 are created. Extraction of the upper layer pattern images 1211 and the lower layer pattern images 1212 can be performed by a technique of region division in image processing, such as region division based on a gray level.

Next, image positional alignment between the reference image 1203 and the measurement image 1205 is performed in the created upper layer pattern images 1211 (S1252), and an amount ($\Delta Ux$, $\Delta Uy$) of the positional misalignment between the hole pattern image 1204 in the reference image 1204 included in the upper layer pattern images 1211 and the hole pattern image 1206 in the measurement image 1205 therein is obtained (S1254).

FIG. 12 illustrates the extracted patterns by binary images, but accuracy in the image positional alignment performed in step S1252 can be improved in some cases by using a different image obtained by performing filtering processing on an original image of only regions of the hole pattern images 1204 and 1206 in the upper layer pattern images 1211 corresponding to the bole patterns 803 and 1003 and regions of the contact plug pattern images 1208 and 1210 in the lower layer pattern image 1212 corresponding to the contact plugs 804 and 1004 or an original image of only corresponding regions of the upper layer pattern images 1211 and the lower layer pattern images 1212.

For the lower layer pattern images 1212, similarly to a case of the upper layer pattern images 1211, image positional alignment between the reference image 1207 and the measurement image 1209 is performed (S1253), and an amount ($\Delta Lx$, $\Delta Ly$) of positional misalignment between the contact plug pattern image 1208 in the reference image 1207 of the lower layer pattern images 1212 and the contact plug pattern image 1210 in the measurement image 1209 thereof is obtained (S1255). Finally, using results obtained in S1254 and 1255, an overlay amount ($\Delta x$, $\Delta y$) is calculated (S1256).

The above method makes it possible to relatively measure how much positional relationship between the two patterns of the upper layer and the lower layer in the measurement image is misaligned with respect to positional relationship between the two patterns of the upper layer and the lower layer in the reference image.

The description in FIG. 12 refers to a case where the image has one pattern, but the image may have a plurality of patterns. In a case where the image has a plurality of patterns, the overlay amount illustrated in FIG. 12 can be calculated on an individual pattern basis, and then an average value of the calculated amounts may be obtained.

Another possible method is a method of collectively processing a plurality of patterns in an image. Specifically, a reference image and a measurement image including a plurality of patterns in upper layer pattern images are compared to each other, and an upper layer pattern positional misalignment amount is obtained. A reference image and a measurement image including a plurality of patterns in lower layer pattern images are compared to each other, and a lower layer pattern positional misalignment amount is obtained. Based on the obtained upper layer pattern positional misalignment amount and the obtained lower layer pattern positional misalignment amount, an overlay amount can be calculated.

Figure 13:
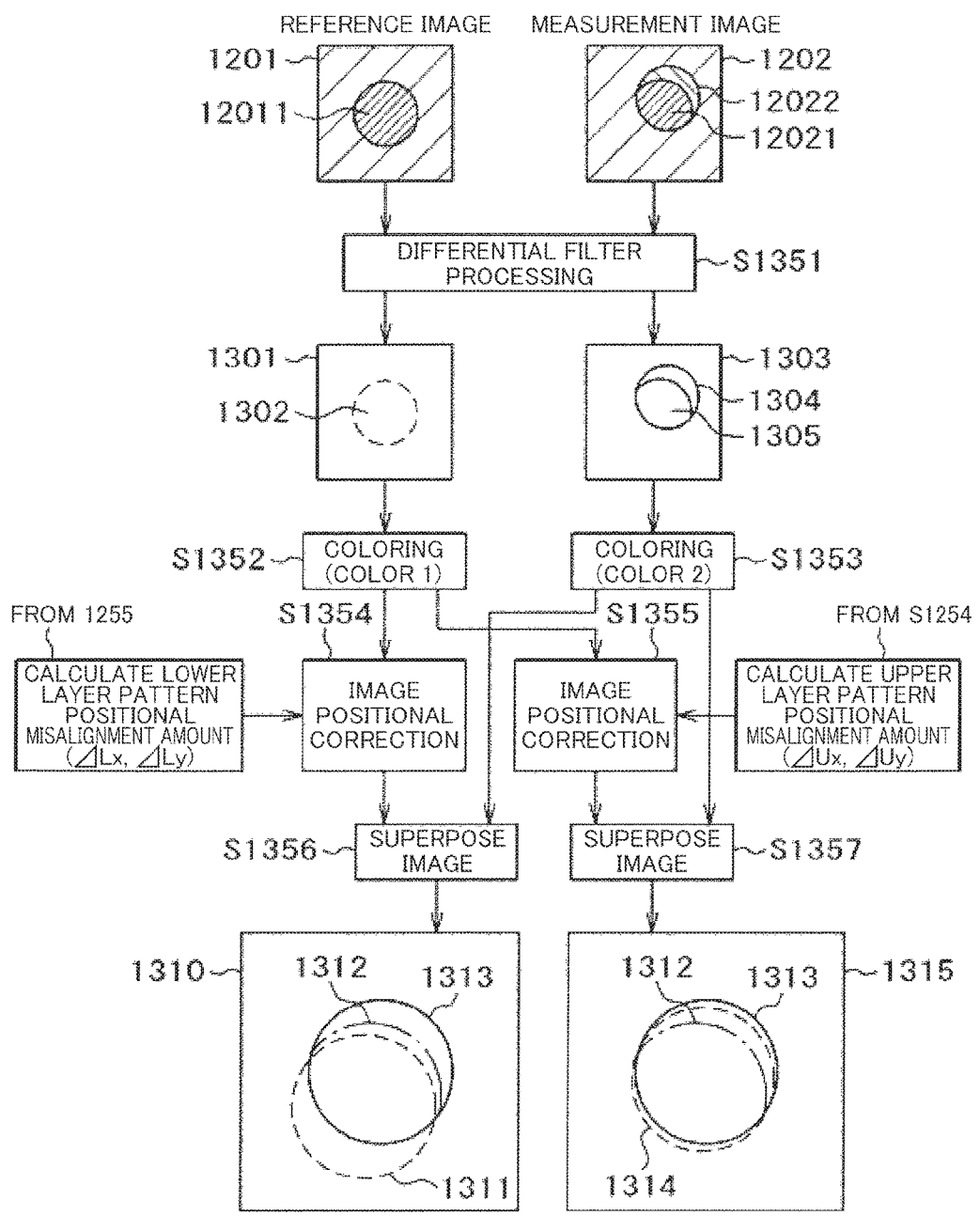
FIG. 13 is a flowchart illustrating procedures of generating an image displaying the overlay according to Example of the invention.

FIG. 13 illustrates procedures of processing of displaying results of the overlay measurement of FIG. 12. Differentiation filter processing is performed on the reference image 1201 and the measurement image 1202 targeted for the measurement, both illustrated in FIG. 12 (S1351) to generate a differential reference image 1301 including an upper layer hole pattern 1302 (also a lower layer contact plug pattern image 1302) and a differential measurement image 1303 including an upper layer hole pattern 1304 and a lower layer contact plug pattern image 1305. For example, a Sobel filter is used as a differential filter.

Next, the differential reference image 1301 is colored in color 1 (S1352), and the differential measurement image 1303 is colored in color 2 (S1353). The color 1 and the color 2 are different from each other, and colors providing excellent color contrast effect are selected. More specifically, the color 1 and the color 2 are in complementary relationship, or only R is used for the color 1 and a mixture of G and B is used for the color 2 in an RGB color model, or a mixture of G and B is used for the color 1 and only R is used for the color 2. In the coloring of the differential reference image 1301, a value obtained by subjecting a gray level of the differential reference image 1301 to linear conversion or non-linear conversion is set as an intensity of the color 1. The same applies to the coloring of the differential measurement image 1303.

Next, image positional correction of the colored differential reference image 1301 is performed by using the lower layer pattern positional misalignment amount ($\Delta Lx, \Delta Ly$) calculated in step S1255 in the process flow of FIG. 12 (S1354), and position of the lower layer contact plug pattern image 1302 (also corresponds to the upper layer hole pattern image) of the differential reference image 1301 is aligned with position of the lower layer contact plug pattern image 1305 of the differential measurement image 1303.

Finally, an image obtained by coloring the differential reference image 1301 in S1352 and subjecting the colored differential reference image 1301 to the positional correction in S1354 is superposed on an image obtained by coloring the differential measurement image 1303 in S1353 (S1356) to obtain a display image 1310. The display image 1310 is obtained by emphasizing a pattern edge by the differential filter processing (S1351) and mutually superposing the reference image and the measurement image colored in the different colors in S1352 and S1353. The display image 1310 is displayed on a screen of the display terminal 756.

Numeral 1311 in the display image 1310 represents an outline of the lower layer contact plug pattern image 1302 in the differential reference image 1301 (also an outline of the upper layer hole pattern image 1302 in the differential reference image 1301), numeral 1312 represents an outline of the lower layer contact plug pattern image 1305 in the differential measurement image 1303, and numeral 1313 represents an outline of the upper layer hole pattern image 1304 in the differential measurement image 1303. The display image 1310 makes it possible to confirm that the positional alignment between the lower layer contact plug pattern image 1302 in the differential reference image 1301 and the lower layer contact plug pattern image 1305 in the differential measurement image 1303 is properly performed.

For better visibility on the display image 1310, the outline 1311 of the lower layer contact plug pattern image 1302 in the differential reference image 1301 and the outline 1312 of the lower layer contact plug pattern image 1305 in the differential measurement image 1303 are drawn with slight misalignment therebetween. On an actual image, the outlines 1311, 1312, and 1313 in the display image 1310 are not thin lines as illustrated in the figure, but wide lines which are brightest at a pattern edge position and become darker with a distance therefrom. In accordance with the way of coloring described above, transmittance is ensured at a portion where any of the outlines 1311, 1312, and 1313 are superposed on each other, thus making it easy to confirm a superposition state of the line patterns with a wide gray scale.

In contrast, to confirm a result of the positional alignment between the upper layer hole pattern image 1302 in the differential reference image 1301 and the upper layer hole pattern image 1304 in the differential measurement image 1303, by using the upper layer pattern positional misalignment amount ($\Delta Ux, \Delta Uy$) calculated in S1254, the positional alignment is performed on the differential reference image 1301 colored in S1352 (S1355), and then after position of the upper layer hole pattern image 1302 in the differential reference image 1301 is aligned with position of the upper layer hole pattern image 1304 in the differential measurement image 1303, superposition on the differential measurement image 1303 colored in S1353 is performed (S1357) to obtain a display image 1315. The display image 1315 is displayed on the screen of the display terminal 756.

The display image 1315 is an image obtained by emphasizing a pattern edge through the differential filter processing (S1351) and superposing the differential reference image 1301 and the differential measurement image 1303 colored in the different colors in 1352 or 1353.

Numeral 1314 in the display image 1315 represents an outline of the upper layer hole pattern image 1302 in the differential reference image 1301 (also an outline of the lower layer contact plug pattern image), numeral 1312 represents an outline of the lower layer contact plug pattern image 1305 in the differential measurement image 1303, and numeral 1313 represents an outline of the upper layer hole pattern image 1304 in the differential measurement image 1303. The display image 1315 makes it possible to confirm that the positional alignment between the upper layer hole pattern image 1302 in the differential reference image 1301 and the upper layer hole pattern image 1304 in the differential measurement image 1303 is performed properly.

For better visibility on the display image 1315, the outline 1314 of the upper layer hole pattern image 1302 in the differential reference image 1301 and the outline 1313 of the upper layer hole pattern image 1304 in the differential measured image 1303 are drawn with slight misalignment therebetween.

Displaying the display image 1310 and the display image 1315 on the screen of the display terminal 756 for the confirmation makes it possible to recognize whether or not the positional alignment has been executed properly. If the positional alignment has been executed properly, it can be said that the upper layer pattern positional misalignment amount ($\Delta Ux, \Delta Uy$) and the lower layer pattern positional misalignment amount ($\Delta Lx, \Delta Ly$) are calculated properly and the overlay value calculated in S1256 of FIG. 12 is reliable. On the contrary, if there is any abnormal misalignment between the outlines (pattern edges) 1311, 1312, and 1313 or between the outlines 1312, 1313, and 1314 in the display image 1310 and the display image 1315, the image positional alignment performed in 1252 and S1253 of FIG. 12 results in failure, and the overlay amount calculated in S1256 includes a mistake.

In the flow of the processing described in FIG. 13, the image positional correction is performed in S1354 and 1355 after the coloring performed in S1352, but order of the aforementioned operations may be reversed so that the coloring may be performed in S1352 after the image positional correction performed in S1354 and 1355.

The flow of the processing described in FIG. 13 has been described, referring to procedures of performing the positional correction of the differential reference image 1301 and superposing the resulting differential reference image 1301 on the differential measurement image 1303 to obtain the display images 1310 and 1315, but the differential measurement image 1303 may be subjected to positional correction and superposed on the differential reference image 1301 to obtain display images.

FIG. 14 illustrates a modified example of the procedures of the processing of displaying the results of the overlay measurement illustrated in FIG. 13. As a result of subjecting a reference image 1201 and a measurement image 1202 to differential filter processing (S1403) as described in S1351 of FIG. 13, as schematically illustrated on images 1411 and 1413, in addition to patterns 1412 and 1414 targeted for measurement, a portion 1415 with a high differential value may appear. Creating a display image including such a portion deteriorates visibility, so that on the reference image 1201, an image 1421 obtained by extracting an upper layer pattern of the reference image 1201 in a binary manner is subjected to inversion processing (S1401) to thereby obtain an upper layer pattern mask image 1422. A white portion 1423 of the upper layer pattern mask image 1422 is defined as 1 and a black portion 1424 thereof is defined as 0. The image 1411 can be subjected to mask processing (S1403) by the upper layer pattern mask image 1422 to thereby erase the portion with the high differential value appearing in addition to the patterns targeted for the measurement and obtain a differential image 1425 corresponding to the image 1302 of FIG. 13.

Similarly, on a measurement image 1202, an image 1431 obtained by extracting an upper layer pattern of the measurement image 1202 in a binary manner is subjected to inversion processing (S1402) to thereby obtain an upper layer pattern mask image 1432. A white portion 1433 of the upper layer pattern mask image 1432 is defined as 1, and a black portion 1434 thereof is defined as 0. With the upper layer pattern mask image 1432, an image 1413 obtained by subjecting the measurement image 1202 to differential filter processing in S1351 can be subjected to mask processing (S1404) to thereby obtain a differential image 1435 corresponding to the image 1303 of FIG. 13 with the erased portion with the high differential value appearing in addition to the patterns targeted for the measurement.

Processing thereafter permits subjecting the image 1425 to the processing in and after the coloring processing S1352 illustrated in FIG. 13 and subjecting the image 1435 to the processing in and after the coloring processing S1353 to thereby obtain display images 1310 and 1315 having a 0 value in regions other than measurement regions of the reference image 1201 and the measurement image 1202. In such a case, the regions other than the measurement regions are black, thus making it possible to clearly display the images, such as the hole patterns 803 and 1003 and the contact plugs 804 and 1004, at portions targeted for the measurement. A value of a portion to be masked is not limited to 0 and it can be replaced with a different value and a different color.

FIG. 15 illustrates a state in which the display images 1310 and 1315 described with reference to FIG. 13 are superposed on each other. The image 1302 (an outline on the hole pattern image) in the differential reference image 1301 described in FIG. 13 is used, in a state illustrated in FIG. 15, as the pattern 1314 for positional alignment with the upper layer pattern 1313 of the differential measurement image 1303 and as the pattern 1311 for positional alignment with the lower layer pattern 1312 of the differential measurement image 1303. Thus, as a result of defining a representative position of the hole pattern image 1302 of the differential reference image 1301, a change in a representative position 1502 (a central position of a pattern 1314 in the example illustrated in FIG. 15) of the hole pattern of the differential reference image 1301 obtained upon the positional alignment with the upper layer pattern of the differential measurement image 1303 and a representative position 1501 (a central position of the pattern 1311 in the example illustrated in FIG. 15) of the hole pattern of the differential reference image 1301 obtained upon the positional alignment with the lower layer pattern of the differential measurement image 1303 is directly provided as an overlay amount. Therefore, a vector display 1601 obtained by linking together the aforementioned points 1501 and 1502 as illustrated in FIG. 16 can display an amount and a direction of the aforementioned misalignment.

A possible way of defining the representative position of the hole pattern of the reference image includes, for example, pixel value weighing of the reference image subjected to differential filter processing and masking. The representative position may be a position which corresponds to a partial region of the image and which is fixed relatively to coordinates of a measurement window set for performing the overlay measurement processing. However, the representative position is not limited to the aforementioned position and may be defined as desired.

FIG. 17 illustrates superposition of the measurement image 1202 itself, instead of the differential measurement image subjected to the differential filter processing and the coloring processing, on the display image 1310 of FIG. 13. This makes it possible to confirm with which position the pattern edge 1311 of the reference image 1201 has been aligned on the original image of the measurement image 1202 on which a lower layer pattern image 12021 and a lower layer image 12022 are displayed. In such a case, for the measurement image 1202 superposed in the image superposition step S1356, gray values of the original measurement image may be evenly assigned to R, G, and B values, and as intensity of saturation of a specific color, the assignment may be achieved by subjecting gray values of the reference image subjected to the differential filter processing to linear conversion or non-linear conversion.

FIG. 18 illustrates superposition of the reference image 1201 itself on which a lower layer pattern image 12011 whose position is aligned with the pattern edge 1311, instead of the differential reference image subjected to the differential filtering processing and the coloring processing, on the display image 1310 of FIG. 13. The same substitute display method is also applicable to the display image 1315 of FIG. 13.

Switching of display elements makes it easier to confirm the results of the overlay measurement. The display elements here in FIG. 13 refer to seven elements including: (1) the differential reference image obtained after the image positional correction processing (S1354); (2) the differential reference image obtained after the image positional correction processing (S1355); (3) the differential measurement image obtained after the coloring processing (S1353); (4) the vector display 1601 of FIG. 16; (5) the differential reference image subjected to the positional correction (S1354) with the lower layer pattern positional misalignment amount (ΔLx, ΔLy); (6) the differential reference image subjected to the positional correction (S1355) with the upper layer pattern positional misalignment amount (ΔUx, ΔUy); and (7) the measurement image. Sequentially changing at least any desired one of the display elements, a superposition thereof, or a combination of superposition thereof makes it easier to confirm the results of the overlay measurement. For example, constantly displaying (3) the differential measurement image obtained after the coloring processing (S1353) and performing confirmation while switching between display and non-display of (1) the reference image obtained after the image positional correction processing (S1354) makes it possible to easily evaluate whether or not position of the lower layer pattern 902 of the reference image is properly aligned with position of the lower layer pattern 1102 of the measurement image.

The method of performing the image positional correction on the reference image based on the lower layer pattern positional misalignment amount or the upper layer pattern positional misalignment amount to perform superposed display of the images has been described above, but it is obvious that positional correction can be performed on the measurement image based on the lower layer pattern positional misalignment amount or the upper layer pattern positional misalignment amount to perform superposed display of the images. In such a case, it should be noted that the lower layer pattern positional misalignment amount or the upper layer pattern positional misalignment amount is reversely directed between a case where the reference image is subjected to the image positional correction and a case where the measurement image is subjected to the image positional correction.

Figure 19:
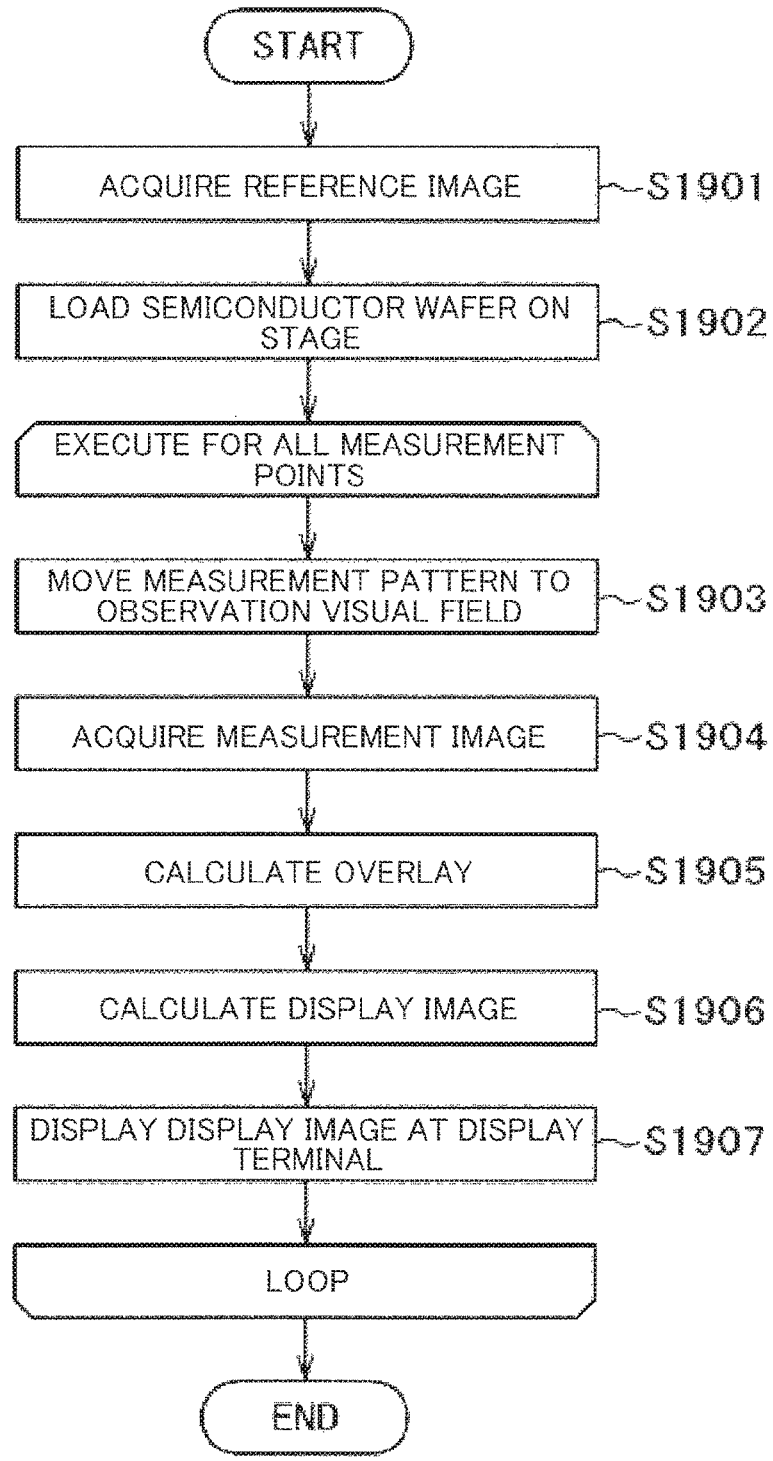
FIG. 19 is a flowchart illustrating procedures of processing of measuring overlay according to Example of the invention.

FIG. 19 illustrates a flow of processing performed for carrying out, with the overlay measurement device 1000 illustrated in FIG. 7, the method of displaying the results of the overlay measurement described with reference to FIG. 12 to FIG. 18.

First, a pattern serving as a reference is imaged with the SEM to acquire a reference image, and the obtained image is then stored as the reference image 1201 into a storage region of the image processing section 752 (S1901). Next, the semiconductor wafer 707 having a circuit pattern targeted for overlay measurement is loaded onto the scanning electron microscope device 700 of the overlay measurement device 1000 illustrated in FIG. 7, and is then placed on the stage 706 (S1902). After the loading of the semiconductor wafer 707, the stage 706 is controlled through the stage controller 755 by the overall control section 753 of the processing and control section 750, and the stage 706 is moved in a manner such that a section of the measurement patterns on the semiconductor wafer 707 without any misalignment falls in an observation visual field of the irradiation optical system 710 of the scanning electron microscope device 700 (S1903).

Next, under control of the deflection coils 704 by the electron optical system control section 754, a region (region targeted for the measurement) including the pattern targeted for the overlay measurement and formed on the semiconductor wafer 707 is scanned by the electron beam 701. A signal obtained by detecting, with the detector 708, the secondary electron generated from the region targeted for the measurement is converted in a digital signal by the A/D converter 709, is inputted as a photographed image into the image processing section 710, and is stored into a memory (not illustrated) of the image processing section 710 (S1904).

Subsequently, the reference image 1201 and the measurement image 1202 are read from the memory of the image processing section 710, and the overlay (Δx, Δy) illustrated in 1212 is calculated at a calculation section (not illustrated) of the image processing section 710 in accordance with the processing flow illustrated in FIG. 12 (S1905). After ending of the calculation processing, the upper pattern positional misalignment amount (ΔUx, ΔUy) illustrated in S1254 of FIG. 12, the lower layer pattern positional misalignment amount (ΔLx, ΔLy) illustrated in S1255 and the overlay amount (Δx, Δy) illustrated in S1256 are stored into the memory of the image processing section 710.

For display of the results, the reference image 1201, the measurement image 1202, the upper layer pattern positional misalignment amount 1210, and the lower layer pattern positional misalignment amount 1211 are read, the processing flow illustrated in FIG. 13 is executed at the calculation section of the image processing section 710, and the display images 1310 and 1315 are calculated and stored into the memory of the image processing section 710 (S1906). The calculated display images 1310 and 1315 are outputted from the image processing section 710 to the overall control section 713, which displays the display image 1310 or the display image 1315 at the display terminal 714 (S1907). Steps S1903 to S1907 are executed for all measurement points.

To partially display only the measurement region at the display terminal 714, upon execution of the processing illustrated in FIG. 12, the upper layer pattern reference image 1204 and the upper layer pattern measurement image 1205 are further stored into the memory of the image processing section 710. In the display of the results, the reference image 1201, the measurement image 1202, the upper layer pattern reference image 1204, the upper layer measurement image 1205, the upper layer pattern positional misalignment amount 1210, and the lower layer pattern positional misalignment amount 1211 are read. At the calculation section of the image processing section 710, the processing flow illustrated in FIG. 13 and FIG. 14 is executed using the read information, and the display image 1310 or the display image 1315 is calculated and stored into the memory of the image processing section 710. The calculated display image 1310 or 1315 is outputted from the image processing section 710 to the overall control section 713, which displays the display image 1310 or the display image 1315 at the display terminal 714.

For the vector display illustrated in FIG. 16, the representative position of the hole pattern of the reference image is calculated at the calculation section of the image processing section 710 described above, and is stored into the memory of the image processing section 710 in correspondence with the reference image. Upon the overlay measurement, the aforementioned overlay amount Δx, Δy and the representative position of the reference image which are stored in the memory of the image processing section 710 are read by the overall control section 713, a vector display of the overlay amount focused on the representative position is generated at a calculation section (not illustrated) of the overall control section 713, and is stored into a memory (not illustrated) of the overall control section 713 and displayed at the display terminal 714.

In the embodiment described above, the reference image is previously recorded, but may be acquired each time from the semiconductor wafer targeted for the measurement.

FIG. 20 illustrates a detailed example of the display provided at the display terminal 714. An ID 20001 refers to an identification number of a reference image 2003, a measurement image 2004, or a resulting measurement image 2005, and corresponds to an overlay measurement section on the wafer. Numeral 2002 represents a numerical value of overlay measurement results. FIG. 20 also displays the reference image 2003 and the measurement image 2004 together with the resulting measurement image 2005, but may not display either or both of the aforementioned images when not necessary. Contents of the display of the resulting measurement image 2005 is switched by measurement results display switching 2006. The measurement results display switching 2006 includes switches respectively located aside of "Image comparison results", "Vector display", "Reference image", "Measurement image", "Reference image mask", and "Measurement image mask", with black circles each indicating that the corresponding item has been selected and white circles each indicating that the corresponding item has not been selected. Switching between Selected and Not selected is performed through, for example, clicking performed on the screen. Hereinafter, each of the items displayed in the measurement results display switching 2006 will be described.

In the item "Image comparison results", in a case where the upper layer is selected, based on the positional misalignment amount of the upper layer pattern 1210, the reference image is subjected to positional correction and superposed on the measurement image to be displayed as the resulting measurement image 2005, and in a case where the lower layer is selected, based on the positional misalignment amount of the lower layer pattern 1211, the reference image is subjected to positional correction and superposed on the measurement image to be displayed as the resulting measurement image 2005, and either or both of the upper layer and the lower layer can be selected. The display image 1315 is a display example when only the upper layer is selected, and the display image 1310 is a display example when only the lower layer is selected.

The item "Vector display" is an item for selecting whether or not to superpose the vector display illustrated in FIG. 16 on the resulting measurement image 2005.

The item "Reference image" is an item for selecting whether the reference image to be superposed on the resulting measurement image 2005 is provided as an original image or a colored edge filter image. In a case where the both are not selected, the reference image is not superposed on the resulting measurement image 2005.

The item "Measurement image" is an item for selecting whether the measurement image to be superposed on the resulting measurement image 2005 is provided as an original image or a colored edge filter image. In a case where the both are not selected, the measurement image is not superposed on the resulting measurement image 2005.

The item "Reference image mask" is an item for selecting whether or not to mask, by the upper layer pattern reference image 1204, the reference image to be superposed on the resulting measurement image 2005.

The item "Measurement image mask" is an item for selecting whether or not to mask, by the upper layer pattern measurement image 1204, the measurement image to be superposed on the resulting measurement image 2005.

In accordance with input of the measurement results display switching described above, the overall control section 713 reads the information stored in the memory of the image processing section 710 or the memory of the overall control section 713, updates display contents of the resulting measurement image 2005, and outputs the updated contents to the display terminal 714.

As described above, with the present Example, in the overlay measurement using the SEM image and using the product circuit of the semiconductor device through comparison between the reference image and the measurement image, when the reference image or the measurement image is displayed in a superposed manner with misalignment in accordance with the obtained overlay amount, it is possible to improve visibility of the superposed display.

REFERENCE SIGNS LIST

700 . . . Scanning electron microscope device,
701 . . . Electron beam,
702 . . . Electron gun,
703 . . . Capacitor lens,
704 . . . Deflection coil,
705 . . . Objective lens,
706 . . . Stage,
707 . . . Wafer,
708 . . . Detector,
750 . . . Processing and control section,
751 . . . A/D converter,
752 . . . Image processing section,
753 . . . Overall control section,
754 . . . Electron optical system control section,
755 . . . Stage controller,
756 . . . Display terminal,
1000 . . . Overlay measurement device.

The invention claimed is:

1. A method of measuring overlay between patterns formed at different layers of a semiconductor device, the method comprising the steps of:
    acquiring a reference image including a pattern without overlay as misalignment between the pattern formed at the upper layer of the semiconductor device and the pattern formed at the lower layer of the semiconductor device by using a scanning electron microscope;
    acquiring a measurement image including the pattern targeted for the measurement and formed at the upper layer of the semiconductor device and the pattern formed at the lower layer of the semiconductor device by using the scanning electron microscope;
    calculating positional misalignment an amount of the patterns corresponding to the acquired reference image and the acquired measurement image;
    generating a differential reference image and a differential measurement image through differential processing performed on the acquired reference image and the acquired measurement image;
    generating a colored differential reference image through coloring with a first color having an intensity value corresponding to a gray value of the generated differential reference image and generating a colored differential measurement image through coloring with a second color being different from the first color and having an intensity value corresponding to a gray value of the generated differential measurement image;
    performing positional correction on the colored differential reference image or the colored differential measurement image by using information of the calculated positional misalignment amount of the pattern; and
    mutually superposing the colored differential reference image and the colored differential measurement image subjected to the positional correction and displaying the colored differential reference image and the colored differential measurement image together with the information of the calculated positional misalignment amount of the patterns.

2. The overlay measurement method according to claim 1, wherein
    the first color and the second color are in complementary relationship.

3. The overlay measurement method according to claim 1, wherein
    in the step of generating the differential reference image and the differential measurement image, the acquired reference image and the acquired measurement image are subjected to differential processing, the acquired reference image and the acquired measurement image are subjected to inversion processing in a binary manner to generate an inverted binary reference image and an inverted binary measurement image, the reference image subjected to the differential processing is masked with the generated inverted binary reference image to generate the differential reference image, and the measurement image subjected to the differential processing is masked with the generated inverted binary measurement image to generate the differential measurement image.

4. The overlay measurement method according to claim 1, wherein
in the step of displaying, instead of the colored differential measurement image, the measurement image is superposed on the colored differential reference image subjected to the positional correction to be displayed thereon.

5. The overlay measurement method according to claim 1, wherein
in the step of displaying, instead of the colored differential reference image, the reference image is superposed on the colored differential measurement image to be displayed thereon.

6. The overlay measurement method according to claim 1, wherein
in the step of calculating the positional misalignment amount of the patterns, an amount of positional misalignment between an image of the pattern formed at the upper layer of the semiconductor device in the acquired reference image and an image of the pattern targeted for the measurement and formed at the upper layer of the semiconductor device in the acquired measurement image and an amount of positional misalignment between an image of the pattern formed at the lower layer of the semiconductor device in the acquired reference image and an image of the pattern targeted for the measurement and formed at the lower layer of the semiconductor device in the acquired measurement image are calculated.

7. The overlay measurement method according to claim 1, wherein
the colored differential reference image and the colored differential measurement image are superposed on each other to be displayed, and results of overlay measurement are displayed is a vector.

8. An overlay measurement device which measures overlay of patterns formed at different layers of a semiconductor device, the overlay measurement device comprising:
scanning electron microscope adapted to acquire a reference image by imaging a region including the pattern without overlay as misalignment between the pattern formed at the upper layer of the he semiconductor device and the pattern formed at the lower layer of the semiconductor device, and to acquire a measurement image by imaging a region including the pattern targeted for the measurement and formed at the upper layer of the semiconductor device and the pattern targeted for the measurement and formed at the lower layer of the semiconductor device;
positional misalignment amount calculator adapted to calculate an amount of positional misalignment between the patterns corresponding to the reference image and the measurement image acquired by the scanning electron microscope;
differential image generator adapted to generate a differential reference image and a differential measurement image by subjecting, to differential processing, the reference image and the measurement image acquired by the scanning electron microscope;
colored differential image generator adapted to generate a colored differential reference image by coloring in a first color having an intensity value corresponding to a gray value of the differential reference image generated by the differential image generator, and generating a colored differential measurement image by coloring in a second color being different from the first color and having as intensity value corresponding to a gray value of the differential measurement image generated by the differential image generator;
image positional corrector adapted to perform positional correction on the colored differential reference image or the colored differential measurement image generated by the colored differential image generator by using information of the amount of the positional misalignment between the patterns calculated by the positional misalignment amount calculator; and
display unit adapted to mutually superpose the colored differential reference image and the colored differential measurement image subjected to the positional correction performed by the image positional corrector, and to display the colored differential reference image and the colored differential measurement image together with the information of the amount of the positional misalignment between the patterns calculated by the positional misalignment amount calculator.

9. The overlay measurement device according to claim 8, wherein
the first color and the second color for the coloring performed by the colored differential image generator are in complementary relationship.

10. The overlay measurement device according to claim 8, wherein
the differential image generator is adapted to perform the differential processing on the reference image and the measurement image acquired by the scanning electron microscope, perform inversion processing on the acquired reference image and the acquired measurement image in a binary manner to generate an inverted binary reference image and an inverted binary measurement image, mask the reference image subjected to the differential processing with the generated inverted binary reference image to generate the differential reference image, and mask the measurement image subjected to the differential processing with the generated inverted binary measurement image to generate the differential measurement image.

11. The overlay measurement device according to claim 8, wherein
with the colored differential measurement image changed, the display unit is adapted to superpose the measurement image on the colored differential reference image subjected to the positional correction to be displayed thereon.

12. The overlay measurement device according to claim 8, wherein
with the colored differential reference image changed, the display unit is adapted to superpose the reference image on the colored differential measurement image to be displayed thereon.

13. The overlay measurement device according to claim 8, wherein
the positional misalignment amount calculator is adapted to calculate: an amount of positional misalignment between an image of the pattern formed at the upper layer of the semiconductor device in the acquired reference image and an image of the pattern targeted for the measurement and formed at the upper layer of the semiconductor device in the acquired measurement image; and an amount of positional misalignment between an image of the pattern formed at the lower layer of the semiconductor device in the acquired reference image and an image of the pattern targeted for the measurement and formed at the lower layer of the semiconductor device in the acquired measurement image.

14. The overlay measurement device according to claim 8, wherein
the positional misalignment calculator is adapted to obtain a vector of overlay as measurement results of the overlay, and the display unit is adapted to display the measurement results of the overlay in the vector together with the superposed display of the colored differential reference image and the colored differential measurement image.

15. An overlay measurement display device displaying measurement results of overlay of patterns formed at different layers of a semiconductor device, the measurement being achieved through comparison between a reference image in a region including the pattern without overlay as misalignment between the pattern formed at the upper layer of the semiconductor device and the pattern formed at the lower layer of the semiconductor device both of which are acquired by imaging with a scanning electron microscope and a measurement image in a region including the pattern targeted for the measurement and formed at the upper layer of the semiconductor device and the pattern targeted for the measurement and formed at the lower layer of the semiconductor device, wherein a colored differential reference image obtained by coloring in a first color having an intensity value corresponding to a gray value of a differential filter image of the reference image and a colored differential measurement image obtained by coloring in a second color different from the first color and having an intensity value corresponding to a gray value of a differential filter image of the measurement image are superposed on each other to be displayed.

16. The overlay measurement display device according to claim 15, wherein
the first color and the second color are in complementary relationship.

17. The overlay measurement display device according to claim 15, wherein
instead of the colored differential measurement image, the measurement image is superposed on the colored differential reference image to be displayed thereon.

18. The overlay measurement display device according to claim 15, wherein
instead of the colored differential reference image, the reference image is superposed on the colored differential measurement image to be displayed thereon.

19. The overlay measurement display device according to claim 15, wherein
with the superposed display of the colored differential reference image and the colored differential measurement image, the measurement results of overlay are displayed in a vector.

* * * * *